US011483941B2

(12) United States Patent
Xiao

(10) Patent No.: US 11,483,941 B2
(45) Date of Patent: Oct. 25, 2022

(54) CLICKABLE PIVOTING COVER AND SHIELD ASSEMBLY AND ELECTRONIC DEVICE USING SAME

(71) Applicant: AMBIT MICROSYSTEMS (SHANGHAI) LTD., Shanghai (CN)

(72) Inventor: Jian-Feng Xiao, Shanghai (CN)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 381 days.

(21) Appl. No.: 16/794,498

(22) Filed: Feb. 19, 2020

(65) Prior Publication Data

US 2020/0267857 A1 Aug. 20, 2020

(30) Foreign Application Priority Data

Feb. 20, 2019 (CN) ........................ 201910127855.3

(51) Int. Cl.
*H05K 5/02* (2006.01)
*H05K 5/03* (2006.01)
*E05D 11/10* (2006.01)

(52) U.S. Cl.
CPC ......... *H05K 5/0226* (2013.01); *E05D 11/105* (2013.01); *H05K 5/03* (2013.01); *E05D 2011/1035* (2013.01); *E05Y 2900/606* (2013.01)

(58) Field of Classification Search
None
See application file for complete search history.

(56) References Cited

U.S. PATENT DOCUMENTS

| | | | | |
|---|---|---|---|---|
| 9,193,561 | B2 * | 11/2015 | Yan | B65H 75/4423 |
| 2004/0256390 | A1 * | 12/2004 | Nam | E05F 1/12 220/264 |
| 2007/0214605 | A1 | 9/2007 | Tu | |
| 2009/0060638 | A1 * | 3/2009 | Cheng | F16C 11/0619 403/96 |
| 2010/0149744 | A1 | 6/2010 | Kitamura et al. | |

(Continued)

FOREIGN PATENT DOCUMENTS

| | | |
|---|---|---|
| CN | 200965653 Y | 10/2007 |
| CN | 201141395 Y | 10/2008 |
| CN | 201301886 Y | 9/2009 |

(Continued)

*Primary Examiner* — James Wu
*Assistant Examiner* — Christopher L Augustin
(74) *Attorney, Agent, or Firm* — ScienBiziP, P.C.

(57) ABSTRACT

A pivoting assembly for an electronic device, being a clickable-open and clickable-shut cover or shield with click-step positioning includes a pivoting shaft extending along an imaginary axis, an inner movable member, an intermediate movable member, and an outer stationary member concentrically surrounding the imaginary axis. First positioning structures and first engaging structures are connected to one of the inner movable member and the intermediate movable member and a number of second positioning structures and second engaging structures are also so connected. When the pivoting shaft is rotated in an opening direction, the first positioning structures compress and slide across the first engaging structures. When the pivoting shaft is rotated in a closing direction, the second positioning structures compress and slide across the second engaging structures.

18 Claims, 7 Drawing Sheets

(56) References Cited

U.S. PATENT DOCUMENTS

2014/0375196 A1* 12/2014 Nguyen .................. G06F 1/181
29/592

FOREIGN PATENT DOCUMENTS

| | | | |
|---|---|---|---|
| CN | 102340939 | A | 2/2012 |
| CN | 103047268 | A | 4/2013 |
| CN | 104051908 | A | 9/2014 |
| TW | M250198 | U | 11/2004 |
| TW | M285894 | U | 1/2006 |
| TW | M311926 | U | 5/2007 |
| TW | 201306719 | A | 2/2013 |
| WO | 2017113202 | A1 | 7/2017 |

* cited by examiner

CLICKABLE PIVOTING COVER AND SHIELD ASSEMBLY AND ELECTRONIC DEVICE USING SAME

FIELD

The present disclosure relates to protection of electronic device, and in particular to a pivoting assembly that enables the cover of an electronic device to pivot.

BACKGROUND

Electronic devices usually have multiple slots for connecting peripheral units. Being exposed to the outside of the electronic device, the device is vulnerable to dust and other contaminants. Therefore, a cover can be connected to the housing of the electronic device, and the cover covers the slot when the slot is not utilized, and the cover is opened when the slot is utilized by peripheral units.

The user experience when opening or closing or positioning the cover can be improved.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
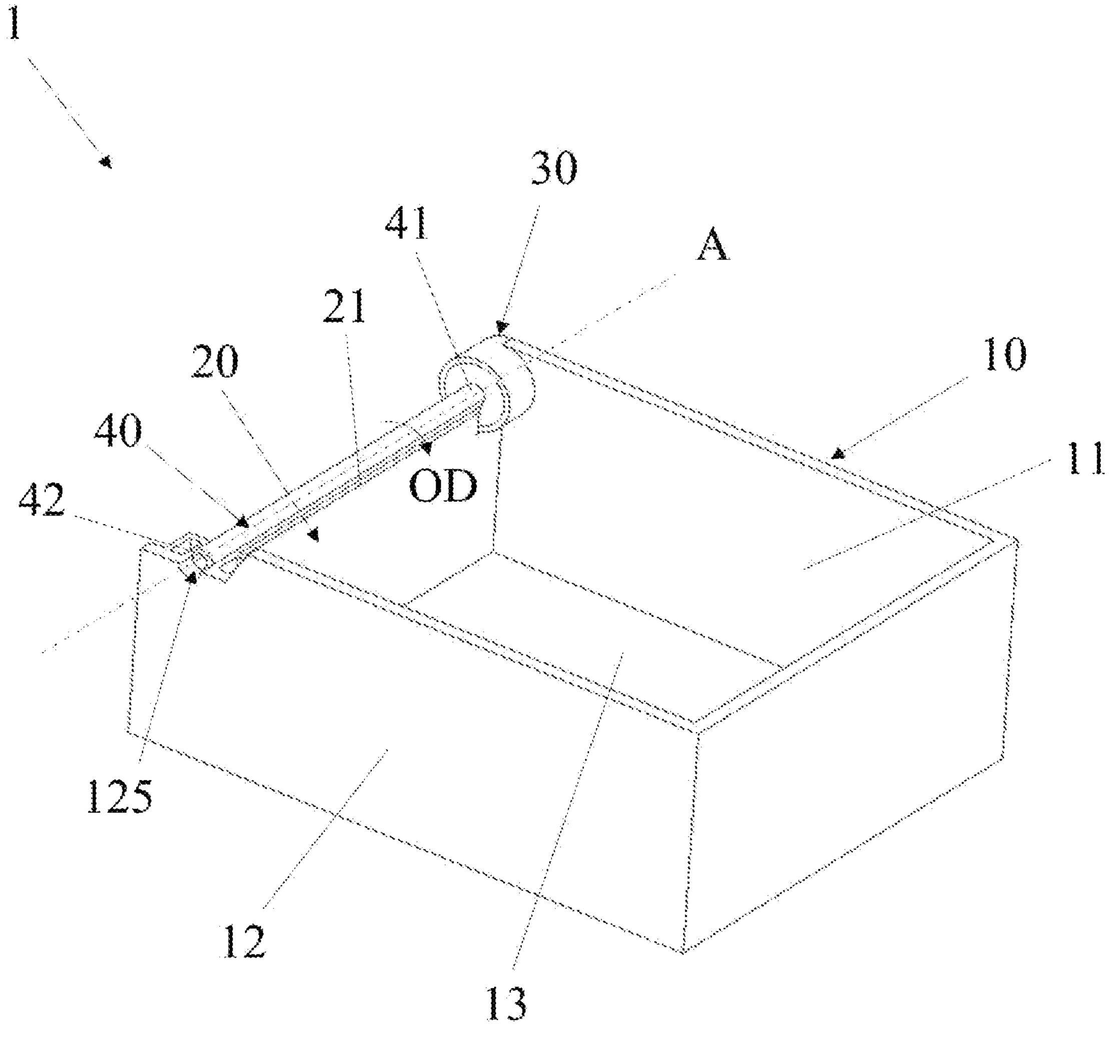
FIG. 1 is a schematic view of an electronic device in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 is a schematic view of an electronic device (electronic device 1) in accordance with the present disclosure. In one embodiment of the present disclosure, the electronic device 1 includes a housing 10, a cover 20, and a pivoting assembly 30. In one embodiment, the housing 10 includes a first side shell 11, a second side shell 12, and a bottom shell 13. The first side shell 11 is disposed opposite to the second side shell 12, and the bottom shell 13 is connected between the first side shell 11 and the second side shell 12. The cover 20 is adjacent to the front edges of the first side shell 11, the second side shell 12, and the bottom shell 13, and can pivot on the first side shell 11 and the second side shell 12 by the pivoting assembly 30.

Figure 2:
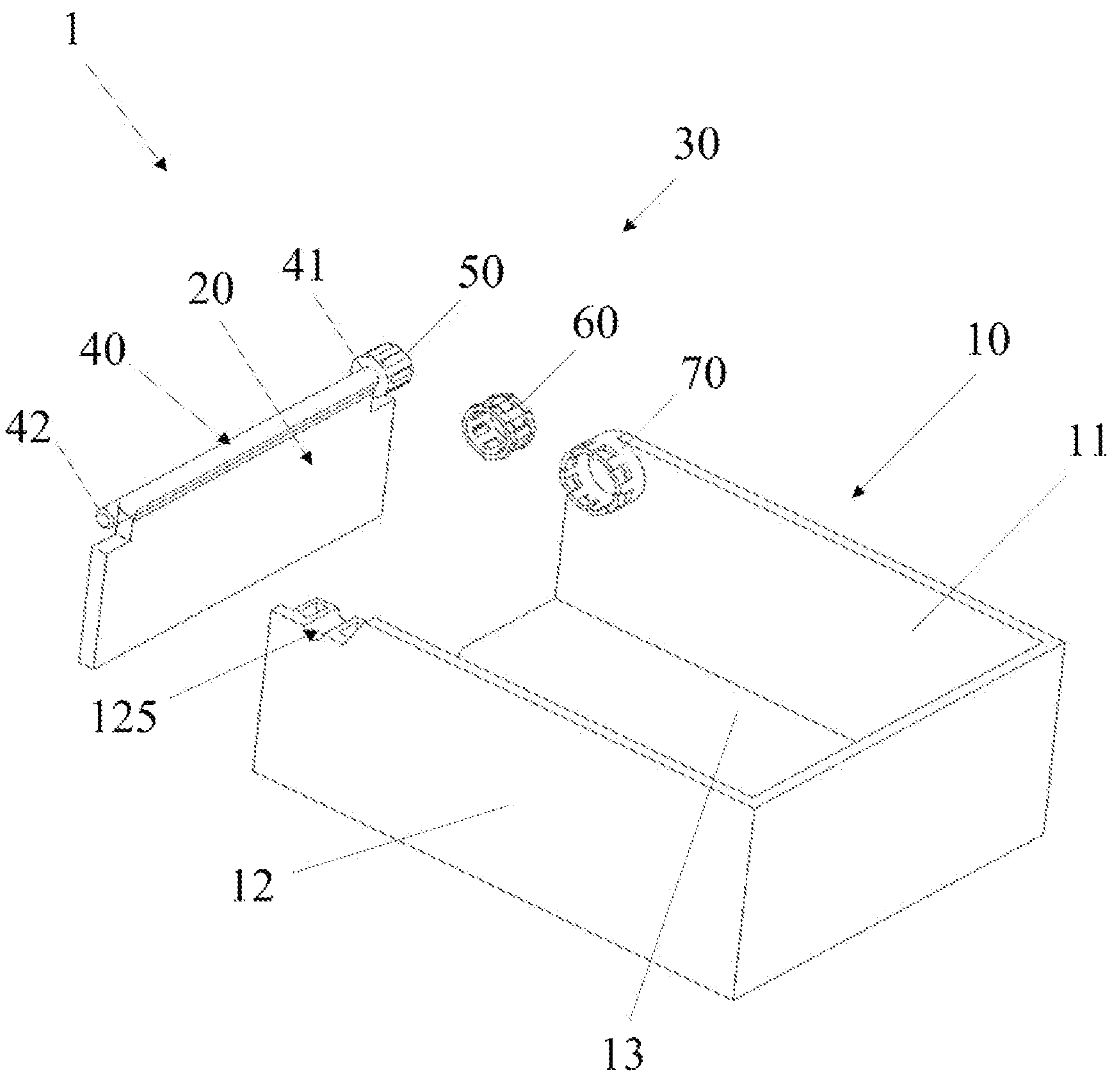
FIG. 2 is a structural exploded view of the electronic device in FIG. 1.
Figure 3:
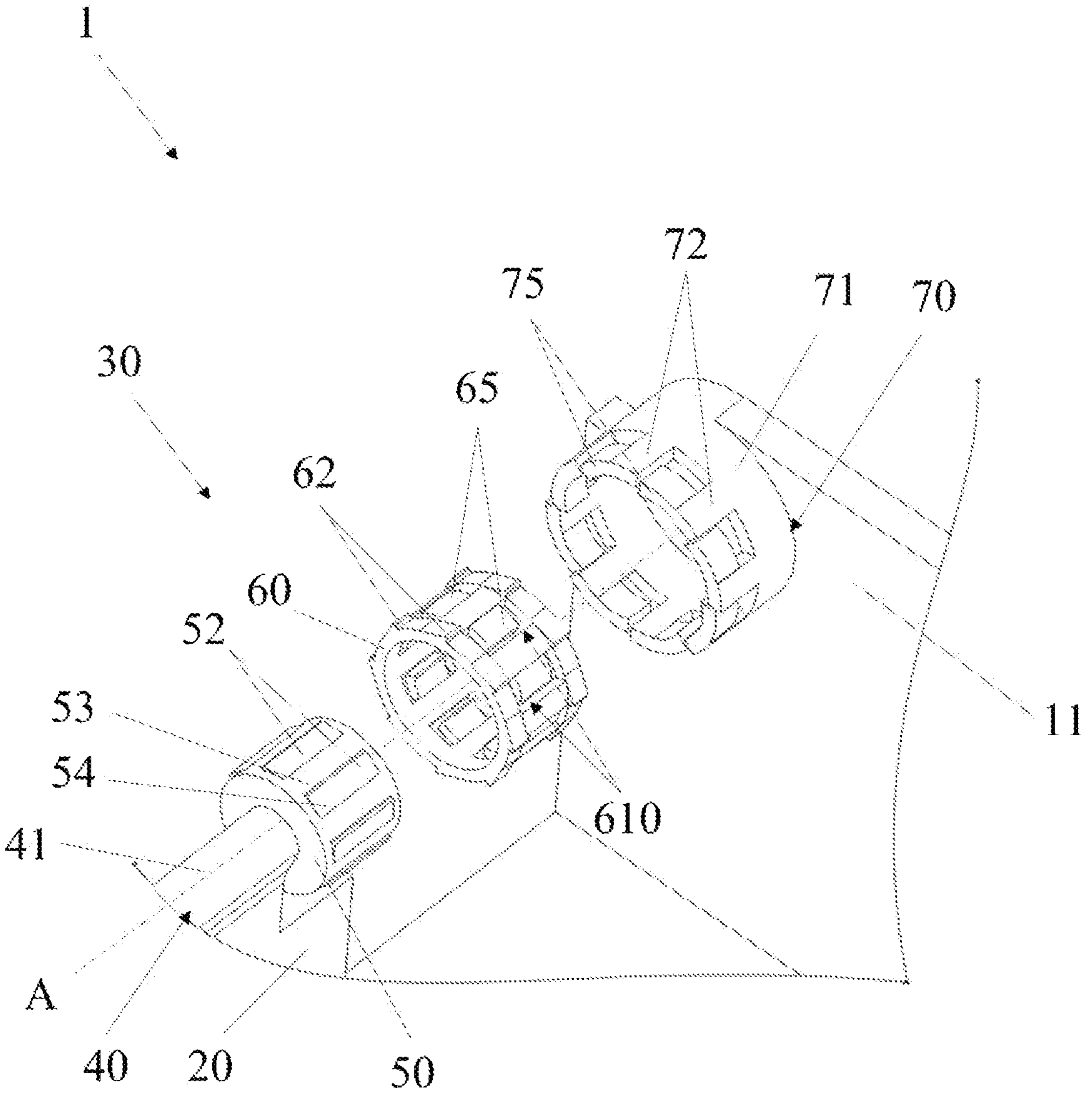
FIG. 3 is a structural exploded view of the components of the pivoting assembly of the device of FIG. 1.

FIG. 2 is a structural exploded view of the electronic device 1 in FIG. 1. FIG. 3 is a structural exploded view of some components of the pivoting assembly 30. In some embodiments of the present disclosure, the pivoting assembly 30 includes a pivoting shaft 40, an inner movable member 50, a number of first engaging structures 52, an intermediate movable member 60, a number of second engaging structures 62, a number of first positioning structures 65, an outer stationary member 70, and a number of second positioning structures 75.

The pivoting shaft 40 extends along an imaginary axis A (shown in FIG. 1), and has a first end 41 and a second end 42 opposite to the first end 41. The first end 41 is connected to the inner movable member 50, and the second end 41 is pivoted on the groove 125 of the top of the second side shell 12.

In the following descriptions, "opening direction" refers to the clockwise direction viewed from the first end 41 of the pivoting shaft 40 along the imaginary axis A, and "closing direction" refers to the counterclockwise direction from the same viewpoint.

The inner movable member 50 may be a columnar structure with a channel penetrating therethrough. The first end 41 of the pivoting shaft 40 is inserted into the channel, and the inner movable member 50 surrounds the imaginary axis A. The first engaging structures 52 are arranged on the outer surface of the inner movable member 50 in the circumferential direction of the pivoting shaft 40. In the embodiment, the circumferential direction is a direction in a plane that is perpendicular to the imaginary axis A, and which surrounds the imaginary axis A. In one embodiment, the first engaging structures 52 are disposed on the central area of the outer surface of the inner movable member 50. Moreover, the first engaging structures 52 are separated from the front edge and the rear edge of the inner movable member 50 in the direction parallel to the imaginary axis A.

In one embodiment, as shown in FIG. 3, the first engaging structures 52 protrude over the outer surface of the inner movable member 50, and each of the engaging structures 52 has a first engaging surface 53 and a first inclined surface 54. The first engaging surface 53 is substantially perpendicular to the outer surface of the inner movable member 50. In some embodiments, an acute angle is between the first engaging surface 53 and the outer surface of the inner movable member 50. An acute angle is between the first inclined surface 54 and the outer surface of the inner movable member 50. In addition, each of the first engaging structures 52 has a triangular profile that extends perpendicular to the pivoting shaft 40 (or imaginary axis A). The first engaging surfaces 53 of the first engaging structures 52 face the same direction (either clockwise or counterclockwise) in the circumferential direction of the pivoting shaft 40. For example, in the embodiment of FIG. 3, the first engaging surfaces 53 face the closing direction.

Figure 4:
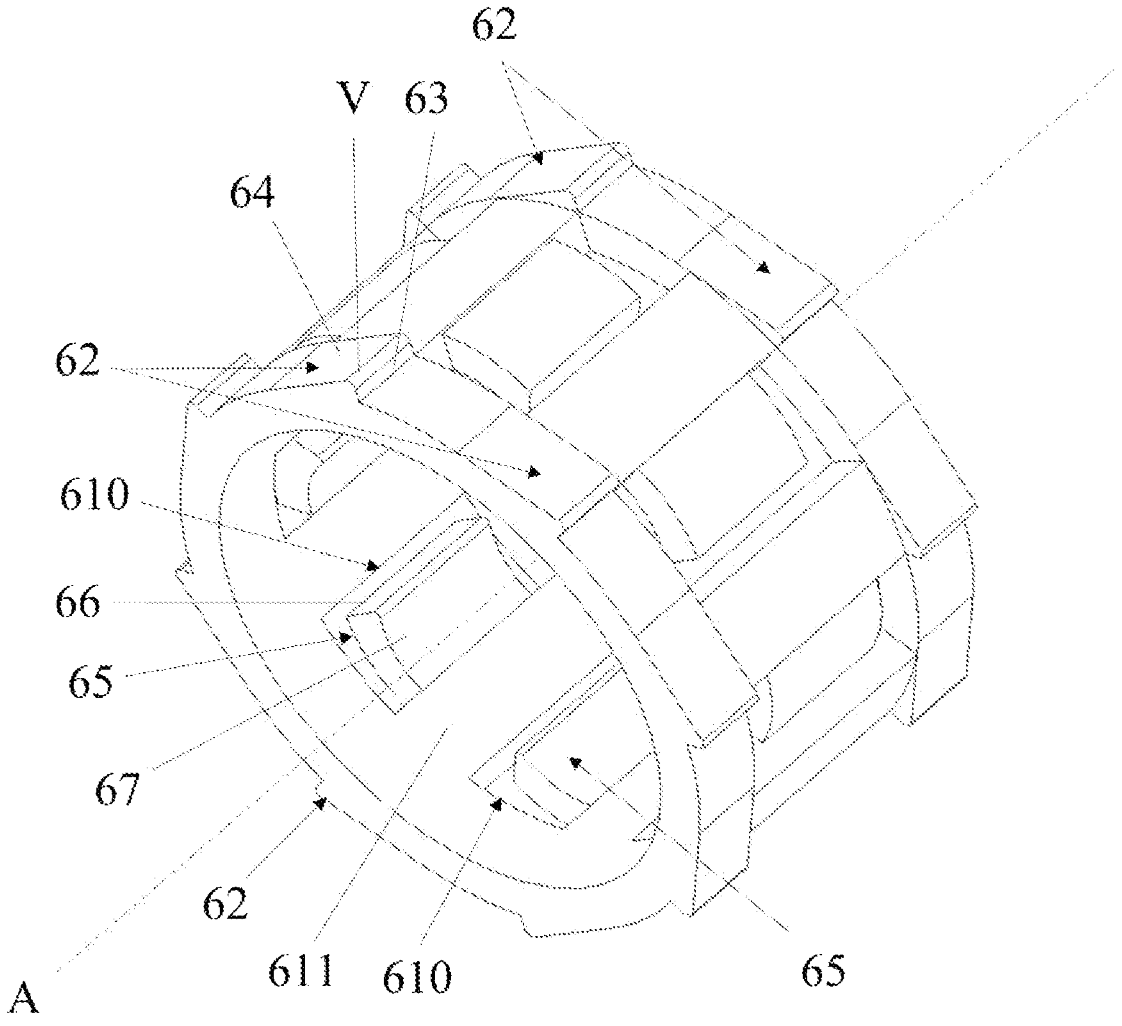
FIG. 4 is a schematic view of the components of the pivoting assembly.

FIG. 4 is a schematic view of the intermediate movable member 60, the second engaging structures 62 and the first positioning structures 65 in accordance with the present disclosure. In one embodiment, the intermediate movable member 60 is a ring-like structure and surrounds the inner movable member 50. Many rectangular openings 610 are arranged on the intermediate movable member 60 in the circumferential direction of the pivoting shaft 40. In one embodiment, the openings 610 are disposed on the center area of the intermediate movable member 60. Moreover, the openings 610 are separated from the front edge and the rear edge of the intermediate movable member 60 in a direction parallel to the imaginary axis A.

The first positioning structures 65 are located in the openings 610, and extend into the gaps between the inner movable member 50 and the intermediate movable member 60 forming the edges of the openings 610 in the clockwise direction. Moreover, each of the first positioning structures 65 has a certain length in the circumferential direction of the pivoting shaft 40. In the direction parallel to the imaginary axis A, gaps are on the opposite sides of the first positioning structures 65 and the edges of the openings 610, and the gaps are not directly connected to each other. In one embodiment, the first positioning structures 65 have first positioning surfaces 66 located at the ends of the positioning structures 65. Each of the first positioning structures 65 has a guide surface 67 facing the inner movable member 50 (as shown in FIG. 3), and the guide surface 67 is connected to the edges of the first positioning surface 66 and the opening 610. The first positioning surfaces 66 of the first positioning structures 65 face the same direction (either clockwise or counterclockwise) in the circumferential direction of the pivoting shaft 40. For example, in the embodiment of FIG. 4, the first positioning surfaces 66 face in the opening direction. The first positioning structures 65 may be made from flexible plastic or metal.

In the embodiment of FIG. 3, the number of the first engaging structures 52 is the same as the number of the first positioning structures 65. The first engaging structures 52 and the first positioning structures 65 are arranged to alternate with each other. Moreover, the first engaging surfaces 53 of the first engaging structures 52 and the first positioning surfaces 66 of the first positioning structures 65 face opposite directions.

Moreover, two adjacent first positioning structures 65 are at uniform intervals with the same center angle relative to the imaginary axis A. In this embodiment, the pivoting assembly 30 includes eight first positioning structures 65, and thus the center angle of two adjacent first positioning structures 65 is 45 degrees. In one embodiment, the pivoting assembly 30 includes at least two first engaging structures 52 and two first positioning structures 65. Two adjacent first positioning structures 65 may have a 180-degree interval so as to enable the cover 20 to perform a 180-degree flip operation.

The positions of the first engaging structures 52 and the first positioning structures 65 are not limited by the embodiment in FIG. 3. In other embodiments, the first positioning structures 65 are formed on the inner movable member 50, and the first engaging structures 52 are formed on the intermediate movable member 60. Moreover, the shape of the first positioning structures 65 may be modified as required. For example, the first positioning structures 65 may include bumps disposed on the inner surface of the intermediate movable member 50. The bumps may be made of a material capable of elastic deformation, such as rubber.

As shown in FIG. 4, the second engaging structures 62 are arranged on the outer surface of the intermediate movable member 60 in the circumferential direction of the pivoting shaft 40. In one embodiment, the second engaging structures 62 are adjacent to the edge of the intermediate movable member 60, and align with the separations 611 between the openings 610.

In one embodiment, the second engaging structure 62 protrudes over the outer surface of the intermediate movable member 60, and has a second engaging surface 63 and a second inclined surface 64. The second engaging surface 63 is substantially perpendicular to the outer surface of the intermediate movable member 60, or there can be an acute angle is between the second engaging surface 63 and the outer surface of the intermediate movable member 60. Moreover, each of the second engaging structures 62 has a triangular profile that extends perpendicular to the pivoting shaft 40 (or the imaginary axis A), and has a vertex V connected to the second engaging surface 63 and the second inclined surface 64. All of the second engaging surfaces 63 of the second engaging structures 62 face in the same direction (either clockwise or counterclockwise) in the circumferential direction of the pivoting shaft 40. For example, in the embodiment of FIG. 4, all of the second engaging surfaces 63 face in the opening direction.

As shown FIG. 3, in one embodiment, the outer stationary member 70 includes a base 71 and columns 72. The base 71 is a ring-like structure, and affixed to the first side shell 11. The columns 72 are connected to the base 71 and are far from the edge of the first side shell 11. The second positioning structures 75 are inserted into the gap between the intermediate movable member 60 and the outer stationary member 70 from the ends of the column 72 in the closing direction. Each of the second positioning structures 75 has a certain length or distance in the circumferential direction of the pivoting shaft 40.

Figure 5:
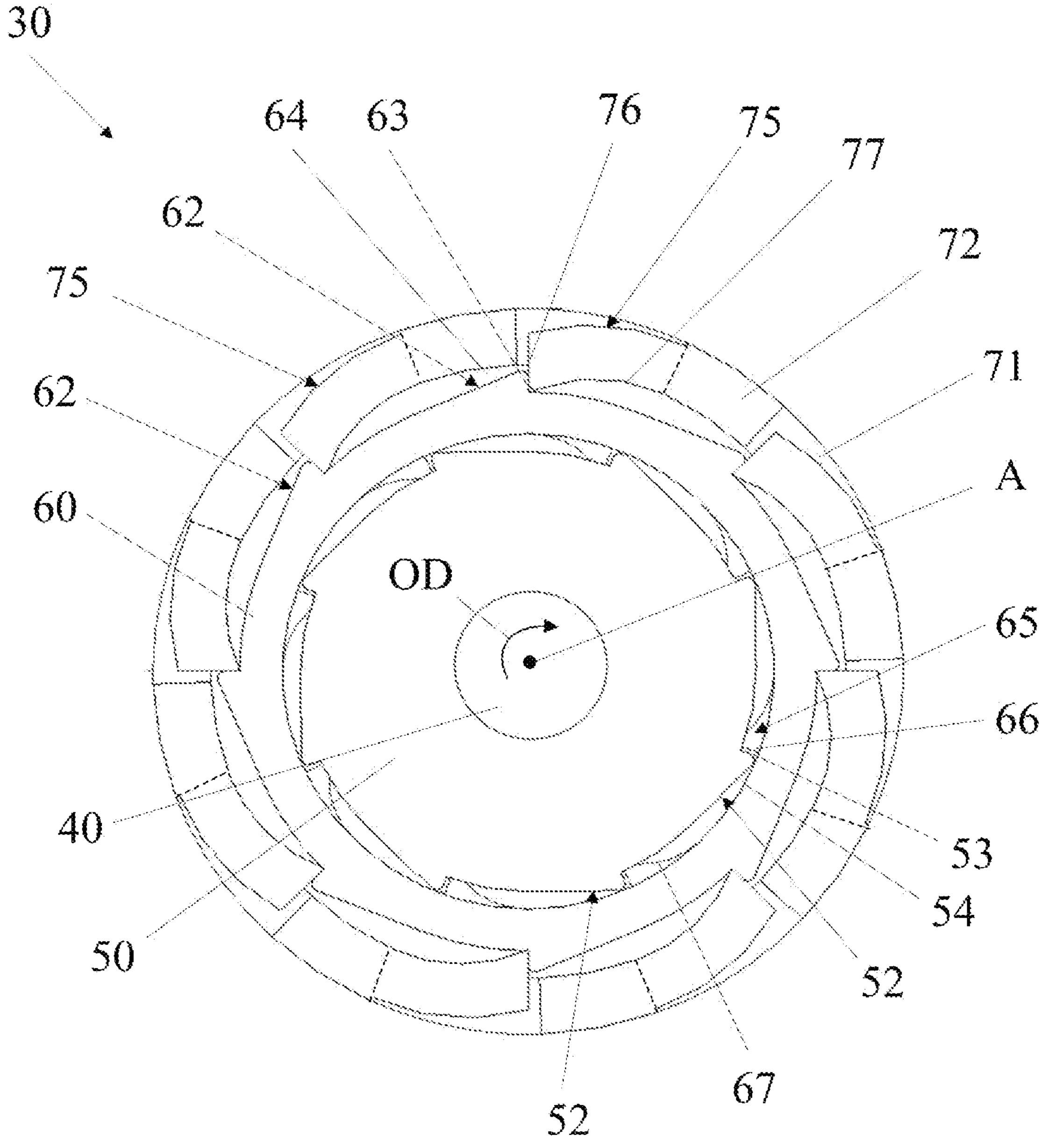
FIG. 5 is a cross-sectional view of the pivoting assembly in an open position in accordance with the present disclosure.

As shown in FIG. 5, in one embodiment, the second positioning structures 75 have second positioning surfaces 76 located at the ends of the second positioning structures 75. Moreover, each of the second positioning structures 75 has a guide surface 77 facing the intermediate movable member 60, and which is connected to the column 72 and the second positioning surface 76. All of the second positioning surfaces 76 of the second positioning structures 75 face in the same direction (either clockwise or counterclockwise) in the circumferential direction of the pivoting shaft 40. For example, in the embodiment of FIG. 5, all of the second positioning surfaces 76 face in the closing direction. The second positioning structures 75 may be made from flexible plastic or metal.

In the embodiment of FIG. 5, the number of the second engaging structures 62 is the same as the number of the second positioning structures 75. The second engaging structures 62 and the second positioning structures 75 are arranged to alternate with each other. Moreover, the second engaging surfaces 63 of the second engaging structures 62 and the second positioning surfaces 76 of the second positioning structures 75 face opposite directions. In addition, two adjacent second positioning structures 75 are at uniform intervals with the same center angle relative to the imaginary axis A. In this embodiment, the pivoting assembly 30 includes eight second positioning structures 75, and thus the center angle of two adjacent second positioning structures 75 is 45 degrees.

The positions of the second engaging structures 62 and the second positioning structures 75 are not limited by the embodiment in FIG. 5. In other embodiments, the second positioning structures 75 are formed on the intermediate movable member 60, and the second engaging structures 62 are formed on the outer stationary member 70. Moreover, the shapes of the second positioning structures 75 may be modified as required. For example, the second positioning structures 75 may include bumps disposed on the inner surface of the outer stationary member 70. The bumps may be made of a material capable of elastic deformation, such as rubber.

In one embodiment of the present disclosure, the operation of the pivoting assembly 30 is explained as follows.

In one embodiment, when the cover 20 is to be opened from the closed state to for example expose a slot or a battery compartment of the electronic components (not shown in figures) inside the housing 10, the user opens the cover 20 in the opening direction (OD).

Figure 6:
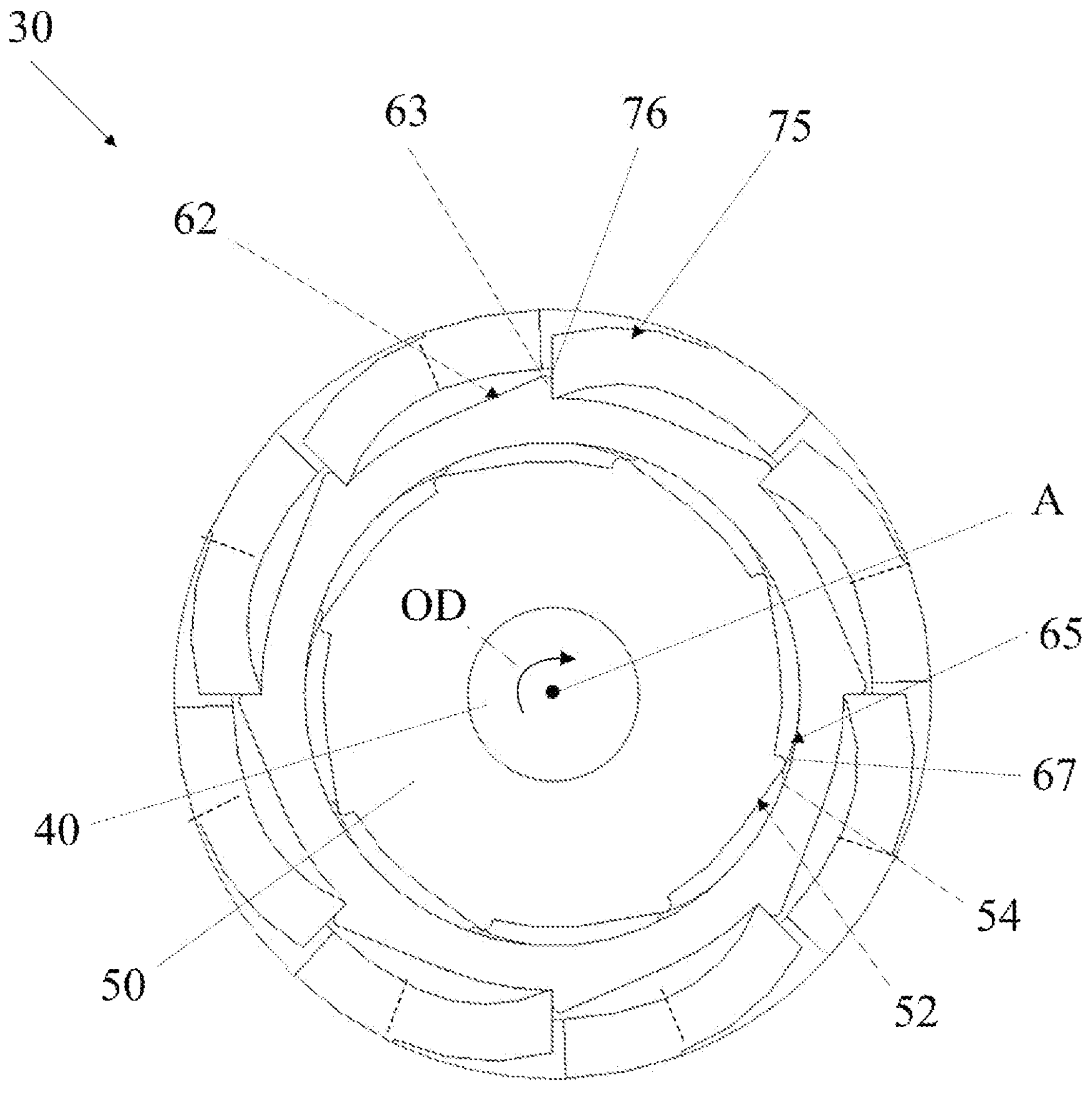
FIG. 6 is a cross-sectional view of the pivoting assembly in a close position in accordance with the present disclosure.

As shown in FIG. 6, during the movement of the cover 20 in direction OD, the pivoting shaft 40 drives the inner movable member 50 to rotate, so that the first engaging structures 52 abut against the guide surfaces 67 of the first positioning structures 65. Until the second engaging surfaces 63 abut against the second positioning surfaces 76, the intermediate movable member 60 can be pushed by the first engaging structures 52, and can rotate in OD until the second engaging surfaces 63 face and abut against the second positioning surface 76. However, when the second engaging surface 63 abuts against the second positioning surface 76, the intermediate movable member 60 cannot be pushed by the first engaging structures 52. The first engaging structures 52 sequentially compress the first positioning structures 65 to deform and slide across the first positioning structures 65 until the cover 20 is set to the desired angle (e.g. 90 degrees or as user requires) relative to the bottom shell 13.

Since the first positioning structures 65 are made of elastic materials, when the first positioning structures 65 are pressed by the first engaging structures 52, the first positioning structures 65 elastically deform and move toward the openings 610 (as shown in FIG. 3). Moreover, after the first engaging structures 52 slide across the first positioning structures 65, the first positioning structures 65 return to their original positions. Therefore, in the process of opening the cover 20, the user experiences a series of clicks by repeated contact and separation of the first engaging structures 52 and first positioning structures 65. Since the first engaging structures 52 are only intermittently in contact with the first positioning structures 65, there is less rotational friction.

Figure 7:
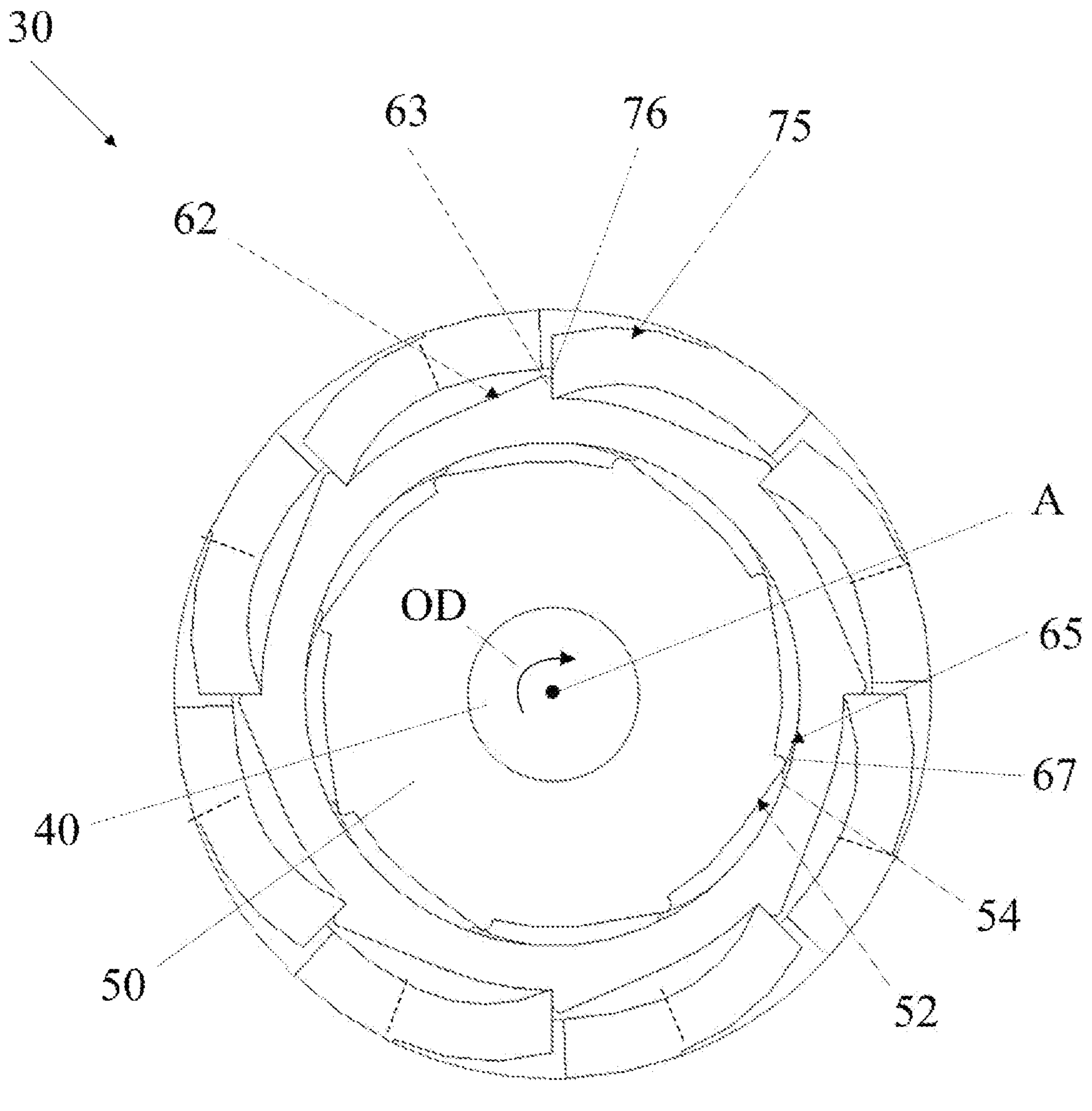
FIG. 7 is a cross-sectional view of the pivoting assembly is closing in accordance with the present disclosure.

When returning the cover 20 to the closed state, the user closes the cover 20 in the closing direction (CD). As shown in FIG. 7, during the movement of the cover 20 in direction CD, the pivoting shaft 40 drives the inner movable member 50 to rotate, so that the first engaging surfaces 53 of the first engaging structures 52 face and abut against the first positioning surfaces 66 of the first positioning structures 65, thereby driving the intermediate movable member 60 to rotate in direction CD.

During the CD rotation, the second engaging structures 62 sequentially compress the second positioning structures 75 to deform, and slide across the second positioning structures 75 until the cover 20 is set to a desired angle (e.g. 0 degrees) relative to the bottom shell 13.

Since the second positioning structures 75 are made of elastic materials, when the second positioning structures 75 are pressed by the second engaging structures 62, the second positioning structures 75 elastically deform and move toward the gaps between any adjacent two columns 72. Moreover, after the second engaging structures 62 slide across the second positioning structures 75, the second positioning structures 75 return to their original positions. Therefore, in the process of closing the cover 20, the user experiences the same series of clicks. Since the second engaging structures 62 are only intermittently in contact with the second positioning structures 75, there is less rotational friction.

Before the cover 20 is completely closed (before the angle of cover 20 relative to the bottom shell 13 becomes zero degrees), gravity may encourage the cover 20 to race towards zero degrees. However, such spontaneous rotation may be stopped by the cooperation of second engaging structures 62 and second positioning structures 75.

Since the torque generated by gravity acting on the cover 20 will be less than the external force required to elastically deform and enable sliding across the second positioning structures 75, gravitational rotation will stop when the vertexes V of the second engaging structures 62 abut against the guide surface 77 of the second positioning structures 75. The cooperation of the second engaging structures 62 and the second positioning structures 75 enables the cover 20 to be suspended at any specific angle close to being fully opened or fully closed.

Many details are often found in the art that are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A pivoting assembly comprising:

a pivoting shaft extending in a direction of an imaginary axis and rotatable about the imaginary axis in an opening direction and in a closing direction opposite to the opening direction;

an inner movable member connected to the pivoting shaft and surrounding the imaginary axis;

an intermediate movable member surrounding the inner movable member;

an outer stationary member surrounding the intermediate movable member;

a plurality of first positioning structures, each connected to the inner movable member;

a plurality of first engaging structures, each elastically deformable and connected to the intermediate movable member, wherein the first positioning structures and the first engaging structures are alternately arranged;

a plurality of second positioning structures, each connected to the intermediate movable member; and a plurality of second engaging structures, each elastically deformable and connected to the outer stationary member, wherein the second positioning structure and the second engaging structure are alternately arranged;

wherein when the pivoting shaft is rotated in the opening direction, the first positioning structures compress and slide across the first engaging structures, and wherein when the pivoting shaft is rotated in the closing direction, the second positioning structures compress and slide across the second engaging structures.

2. The pivoting assembly as claimed in claim 1, wherein each of the second positioning structures has a second positioning surface, each of the second engaging structures has a second engaging surface, and when the pivoting shaft is rotated in the opening direction, the second positioning surface abut against the second engaging surface, and wherein each of the first positioning structures has a first positioning surface, each of the first engaging structures has a first engaging surface, and when the pivoting shaft is rotated in the closing direction, the first positioning surface abut against the first engaging surface.

3. The pivoting assembly as claimed in claim 2, wherein the first engaging surface and the second engaging surface face opposite directions in a circumferential direction of the pivoting shaft.

4. The pivoting assembly as claimed in claim 2, wherein each of the second engaging structures has a length in an circumferential direction of the pivoting shaft, and each of the second engaging structures extends into a gap between the intermediate movable member and the outer stationary member, and the second engaging surface are located at ends of the second engaging structures.

5. The pivoting assembly as claimed in claim 4, wherein each of the second positioning structures has a guide surface, and when a rotation of the pivoting shaft in the closing direction stops, the second engaging structures abut against the guide surface, and the guide surface face the outer stationary member, and are connected to the second engaging surface.

6. The pivoting assembly as claimed in claim 5, wherein each of the second positioning structures comprises an inclined surface adjacent to one of the second positioning surface, when the rotation of the pivoting shaft rotating in the closing direction stops, vertexes of the second positioning surface and the inclined surface abut against the guide surface.

7. The pivoting assembly as claimed in claim 1, wherein the intermediate movable member is a ring-like structure, and a plurality of openings are arranged in a circumferential direction of the intermediate movable member, the first positioning structures are disposed in the openings, and extend from edges of the openings to the inner movable member, and the second engaging structures are disposed on an outer surface of the intermediate movable member that faces the outer stationary member.

8. The pivoting assembly as claimed in claim 7, wherein the openings are located on a center area of the intermediate movable member, and the second engaging structures are adjacent to an edge of the intermediate movable member.

9. The pivoting assembly as claimed in claim 1, wherein the outer stationary member comprises a ring-like base and a plurality of columns connected to an edge of the ring-like base, and the second positioning structures extend from the columns to the intermediate movable member.

10. An electronic device comprising:

a housing comprising two opposite side shells;

a cover located between the side shells; and a pivoting assembly comprising:

a pivoting shaft extending in a direction of an imaginary axis and rotatable about the imaginary axis in an opening direction and in a closing direction opposite to the opening direction;

an inner movable member connected to the pivoting shaft and surrounding the imaginary axis;

an intermediate movable member surrounding the inner movable member;

an outer stationary member surrounding the intermediate movable member;

a plurality of first positioning structures, each connected to the inner movable member;

a plurality of first engaging structures, each elastically deformable and connected to the intermediate movable member, wherein the first positioning structures and the first engaging structures are alternately arranged;

a plurality of second positioning structures, each connected to the intermediate movable member; and a plurality of second engaging structures, each elastically deformable and connected to the outer stationary member, wherein the second positioning structure and the second engaging structure are alternately arranged;

wherein when the pivoting shaft is rotated in the opening direction, the first positioning structures compress and slide across the first engaging structures, wherein when the pivoting shaft is rotated in the closing direction, the second positioning structures compress and slide across the second engaging structures, wherein the pivoting shaft is connected to the cover, and the outer stationary member is connected to one of the side shells of the housing so as to enable the cover to rotate relative to the housing.

11. The electronic device as claimed in claim 10, wherein each of the second positioning structures has a second positioning surface, each of the second engaging structures has a second engaging surface, and when the pivoting shaft is rotated in the opening direction, the second positioning surface abut against the second engaging surface, and wherein each of the first positioning structures has a first positioning surface, each of the first engaging structures has a first engaging surface, and when the pivoting shaft is rotated in the closing direction, the first positioning surface abut against the first engaging surface.

12. The electronic device as claimed in claim 11, wherein the first engaging surface and the second engaging surface face opposite directions in a circumferential direction of the pivoting shaft.

13. The electronic device as claimed in claim 11, wherein each of the second engaging structures has a length in a circumferential direction of the pivoting shaft, and each of the second engaging structures extends into a gap between the intermediate movable member and the outer stationary member, and the second engaging surface are located at ends of the second engaging structures.

14. The electronic device as claimed in claim 13, wherein each of the second positioning structures has a guide surface, and when a rotation of the pivoting shaft in the closing direction stops, the second engaging structures abut against the guide surface, and the guide surfaces face the outer stationary member, and are connected to the second engaging surface.

15. The electronic device as claimed in claim 14, wherein each of the second positioning structures comprises an inclined surface adjacent to one of the second positioning surface, when the rotation of the pivoting shaft rotating in the closing direction stops, vertexes of the second positioning surface and the inclined surface abut against the guide surface.

16. The electronic device as claimed in claim 10, wherein the intermediate movable member is a ring-like structure, and a plurality of openings are arranged in a circumferential direction of the intermediate movable member, the first positioning structures are disposed in the openings, and extend from edges of the openings to the inner movable member, and the second engaging structures are disposed on an outer surface of the intermediate movable member that faces the outer stationary member.

17. The electronic device as claimed in claim 16, wherein the openings are located on a center area of the intermediate movable member, and the second engaging structures are adjacent to an edge of the intermediate movable member.

18. The electronic device as claimed in claim 10, wherein the outer stationary member comprises a ring-like base and a plurality of columns connected to an edge of the ring-like base, and the second positioning structures extend from the columns to the intermediate movable member.

* * * * *